(12) United States Patent
Allee

(10) Patent No.: US 6,236,280 B1
(45) Date of Patent: May 22, 2001

(54) LOW-NOISE VOLTAGE CONTROLLED OSCILLATOR

(75) Inventor: Daren Allee, Austin, TX (US)

(73) Assignee: Advanced Micro Devices Inc., Austin, TX (US)

( * ) Notice: Subject to any disclaimer, the term of this patent is extended or adjusted under 35 U.S.C. 154(b) by 0 days.

(21) Appl. No.: 09/400,509

(22) Filed: Sep. 20, 1999

(51) Int. Cl.[7] .......................... H03K 3/0231; H03K 3/03
(52) U.S. Cl. ................ 331/111; 331/113 R; 331/143; 331/144
(58) Field of Search .................. 331/111, 113 R, 331/135, 143, 144, 57

(56) References Cited

U.S. PATENT DOCUMENTS

| | | | |
|---|---|---|---|
| 4,236,121 | * | 11/1980 | Senturia .................................. 331/57 |
| 4,972,162 | * | 11/1990 | Banu ..................................... 331/111 |
| 5,233,315 | * | 8/1993 | Verhoeven ............................ 331/143 |

* cited by examiner

*Primary Examiner*—Siegfried H. Grimm
(74) *Attorney, Agent, or Firm*—Williams, Morgan & Amerson

(57) ABSTRACT

A voltage controlled oscillator has first and second complementary output terminals. A first edge delay circuit has an input terminal, an output terminal, and a control input terminal. The input terminal is coupled to the first complementary output terminal. A first comparator has a first, second and third input terminal, an output terminal, and a control input terminal. The first input terminal is coupled to the output terminal of the first edge delay circuit. The second input terminal is coupled to the first complementary output terminal. The first comparator output terminal is coupled to the second complementary output terminal. A second edge delay circuit has an input terminal, an output terminal, and a control input terminal. The input terminal is coupled to the second complementary output terminal. A second comparator has a first, second and third input terminal, an output terminal, and a control input terminal. The first input terminal is coupled to the output terminal of the second edge delay circuit. The second input terminal is coupled to the second complementary output terminal. The second comparator output terminal is coupled to the first complementary output terminal. The control inputs of the first and second comparators and the first and second edge delay circuits are coupled together and adapted to allow each circuit to transition from at least one logic level to another logic level at a rate responsive to the magnitude of a signal applied thereto. A feedback circuit is coupled between the first and second complementary output terminals and the third inputs of the first and second comparator circuits.

18 Claims, 3 Drawing Sheets

LOW-NOISE VOLTAGE CONTROLLED OSCILLATOR

BACKGROUND OF THE INVENTION

1. Field of the Invention

This invention relates generally to a voltage controlled oscillator, and, more particularly, to a low-noise, voltage controlled oscillator.

2. Description of the Related Art

In the field of wireless telecommunications, noise problems are a significant problem. For example, in cordless telephone sets, a handset and base communicate over a radio link instead of through a wire. Noise may reduce the useable range, or more problematic, even eliminate proper operation by interfering with the radio link between the handset and the base of the telephone set.

Some noise is environmental in nature. That is, some noise comes from the environment in which the telephone set is located. For example, other electronic equipment operating near the telephone set can produce EMI (electromagnetic interference) that causes noise to be impressed onto the circuitry of the telephone set. Shielding the telephone set can reduce some environmental noise, however, in applications such as cordless telephones, shielding may not be entirely effective. In fact, cordless telephones have been recently designed to operate in a frequency range (~900 MHz) that should normally be outside the range of noise produced by many home appliances. That is, the radio signals delivered between the handset and the telephone base are carried by a 900 MHz electromagnetic signal. Most home appliances do not produce EMI in this frequency range.

Another type of noise that can impair voice signal clarity arises from inside the telephone set. That is, the telephone set may produce noise internally that is impressed on the radio signal. Two examples are device noise and switching noise. Oscillators are commonly used to produce the ~900 MHz carrier signal used in cordless telephones. Any noise introduced by the oscillator will ultimately be delivered over the radio link, interfering with the proper operation.

The present invention is directed to overcoming, or at least reducing the effects of, one or more of the problems set forth above.

SUMMARY OF THE INVENTION

In one aspect of the present invention, a voltage controlled oscillator having first and second complementary output terminals is provided. A first edge delay circuit has an input terminal, an output terminal, and a control input terminal. The input terminal is coupled to the first complementary output terminal. The first edge delay circuit is capable of delivering a signal on the output terminal that varies between first and second logic levels at first and second preselected rates in response to detecting a variation between first and second logic levels at the input terminal. The first edge delay circuit is capable of varying at least one of the first and second preselected rates in response to receiving a signal at the control input terminal. A first comparator has a first input terminal, an output terminal, and a control input terminal. The first comparator first input terminal is coupled to the output terminal of the first edge delay circuit. The first comparator output terminal is coupled to the second complementary output terminal. The first comparator circuit is capable of delivering a signal on the output terminal that varies between first and second logic levels at first and second preselected rates in response to detecting a variation between first and second logic levels at said first input terminal. The first comparator is capable of varying at least one of the first and second preselected rates in response to receiving a signal at the control input terminal. The control input terminals of the first edge delay circuit and the first comparator are coupled together. A feedback circuit is coupled between the second complementary output terminals and the first comparator circuit.

In another aspect of the present invention, a voltage controlled oscillator that has first and second complementary output terminals is provided. A first edge delay circuit has an input terminal, an output terminal, and a control input terminal. The input terminal is coupled to the first complementary output terminal. A first comparator has a first, second and third input terminal, an output terminal, and a control input terminal. The first input terminal is coupled to the output terminal of the first edge delay circuit. The second input terminal is coupled to the first complementary output terminal. The first comparator output terminal is coupled to the second complementary output terminal. A second edge delay circuit has an input terminal, an output terminal, and a control input terminal. The input terminal is coupled to the second complementary output terminal. A second comparator has a first, second and third input terminal, an output terminal, and a control input terminal. The first input terminal is coupled to the output terminal of the second edge delay circuit. The second input terminal is coupled to the second complementary output terminal. The first comparator output terminal is coupled to the first complementary output terminal. The control inputs of the first and second comparators and the first and second edge delay circuits are coupled together and adapted to allow each circuit to transition from at least one logic level to another logic level at a rate responsive to the magnitude of a signal applied thereto. A feedback circuit is coupled between the first and second complementary output terminals and the third inputs of the first and second comparator circuit.

BRIEF DESCRIPTION OF THE DRAWINGS

The invention may be understood by reference to the following description taken in conjunction with the accompanying drawings, in which like reference numerals identify like elements, and in which.

Figure 1:
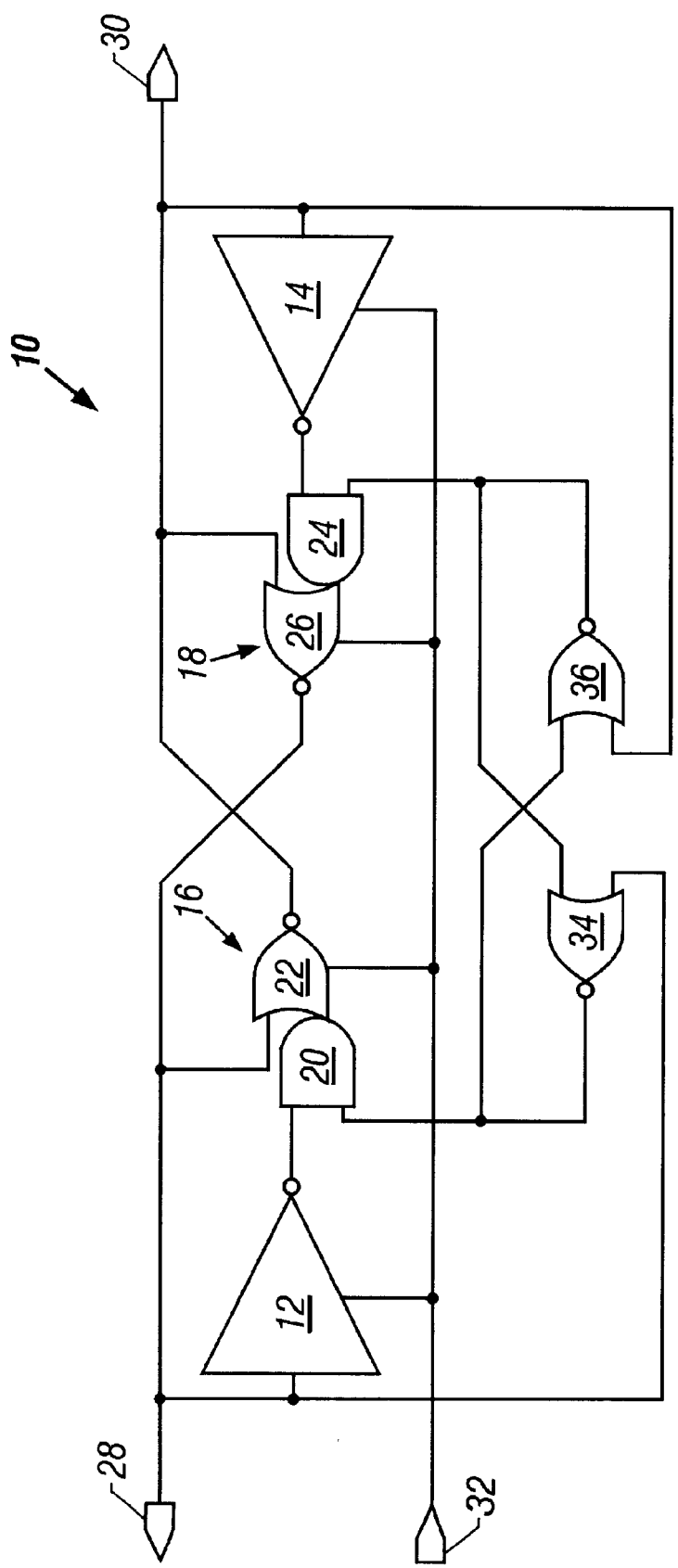
FIG. 1 illustrates an electrical schematic of one embodiment of a voltage controlled oscillator.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular, to FIG. 1, a schematic of one embodiment of a voltage controlled oscillator 10 is shown. The voltage controlled oscillator 10 includes first and second edge delay circuits 12, 14. The edge delay circuits 12, 14 have output terminals respectively connected to first and second comparator circuits 16, 18. The comparator circuits 16, 18 are respectively formed from an AND gate 20, 24 having its output terminal coupled to an input terminal of a NOR gate 22, 26. The output terminals of the comparator circuits 16, 18 are coupled to complementary phase output terminals 30, 28. The complementary phase output terminals 28, 30 are also coupled to the input terminals of the edge delay circuits 12, 14 and to one of the input terminals of the NOR gates 22, 26.

Oscillation of the VCO 10 is ensured by a pair of NOR gates 34, 36. Each of the NOR gates 34, 36 has a first input terminal coupled to the complementary phase output terminals 28, 30. Output terminals of the NOR gates 34, 36 are coupled to a second input terminal of the AND gates 20, 24, respectively. The output terminals of the NOR gates 34, 36 are also cross coupled to a second input terminal of the NOR gates 36, 34, respectively.

The frequency at which the VCO 10 oscillates is effected by a control input terminal 32 coupled to a control input terminal of the NOR gates 22, 26 and the edge delay circuits 12, 14. An analog voltage placed on the control input terminal 32 affects the rate at which the edge delay circuits 12, 14 charge to a logically high voltage level and the level at which the comparator circuits 16, 18 switch between a logically low level and a logically high level. Thus, a single control voltage is advantageously used in multiple components to control the frequency of the VCO 10.

Figure 4:
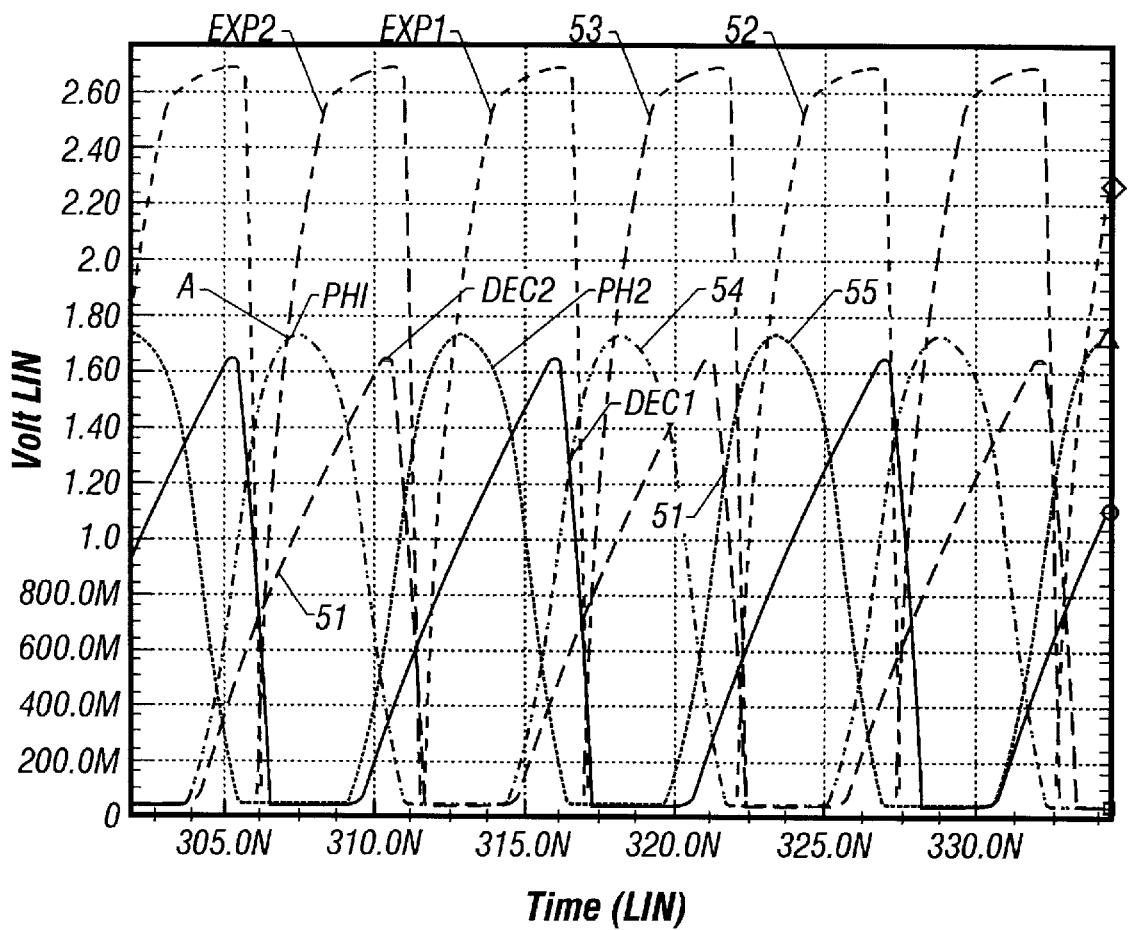
FIG. 4 illustrates a timing diagram of waveforms corresponding to various nodes of the voltage controlled oscillator of FIG. 1.

The edge delay circuits 12, 14 are capable of pulling their output terminals to a logically low level relatively quickly, whereas the transition to a logically high level occurs substantially slower. Operation of the VCO 10 may be understood by reference to the timing diagram of FIG. 4. The timing diagram of FIG. 4 includes representations of various terminals of FIG. 1. For example, the waveforms at the output terminals of the edge delay circuits 12, 14 are represented by the lines labeled 50 and 51, respectively. Likewise, the waveforms at the output terminals of the NOR gates 34, 36 are represented by the lines labeled 52 and 53, respectively. The waveforms present at the complementary phase output terminals 30, 28 are represented by the lines labeled 55, 54, respectively.

For purposes of describing the operation of the VCO 10, assume an initial condition where the output 54 of the complementary phase output terminal 28 is at a logically high level and just beginning a transition to a logically low level (point A on line 54). As the output 54 transitions to a logically low level, it causes the output 50 of the edge delay circuit 12 to begin a relatively slow transition to a logically high level. At the same time, the logically low level at the output 54, through the comparator circuit 16 causes the output 55 to rapidly transition to a logically high level. The output 55 will remain at the logically high level until the relatively slow charging output 50 reaches the logically high level. Once the output 50 reaches the logically high level, the output 55 of the comparator circuit 16 rapidly transitions to a logically low level. The logically low level of the output 55 causes the output 51 of the edge delay circuit 14 to begin a relatively slow transition to a logically high level, and to immediately transition the output 54 back to a logically high level. Once the output 51 reaches the logically high level, the output 54 of the comparator circuit 18 rapidly transitions to a logically low level, repeating the operation.

It should be appreciated that the VCO 10 does not exhibit a hysteresis effect, which eliminates regenerative feedback, and thus, noise sensitivity. It should also be appreciated that the logic circuitry used in the VCO 10 could be readily modified to provide a relatively fast high-to-low transition and a relatively slow low-to-high transition by, inter alia, replacing the NOR gates 22, 26 with NAND gates (not shown) and the AND gates 20, 24 with OR gates (not shown).

Figure 2:
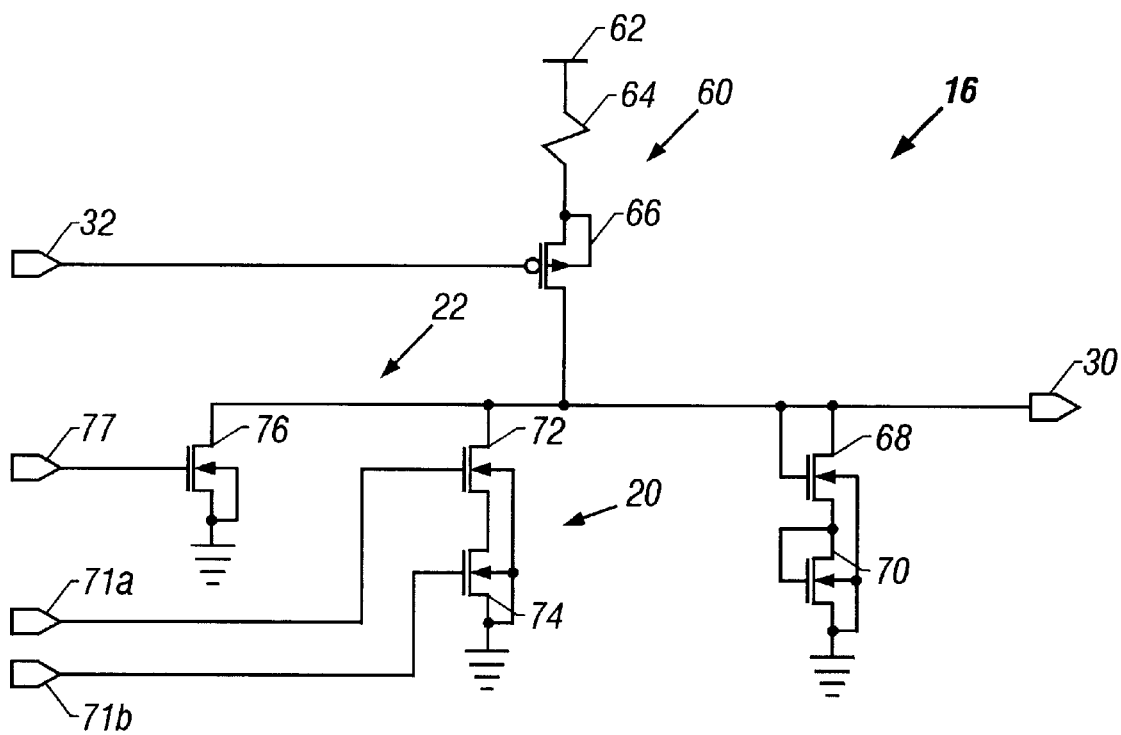
FIG. 2 illustrates an electrical schematic of one embodiment of a comparator circuit of the voltage controlled oscillator of FIG. 1.

Turning now to FIG. 2, an electrical schematic of one embodiment of the comparator circuit 16 of FIG. 1 is shown. A low noise current source 60 is coupled to a power supply 62. The current source 60 is formed from a serially connected resistor 64 and a P-intrinsic transistor 66. The gate of the transistor 66 is coupled to the control input terminal 32, such that an analog voltage placed on the control input terminal 32 affects the magnitude of the current supplied. A pair of transistors 68, 70 are gate-to-drain coupled in series between system ground and the complementary phase output terminal 30. The transistors 68, 70 clamp the voltage appearing at the complementary phase output terminal 30 to about a two threshold voltage drop. This keeps the current source 60 working despite variations in the supply voltage.

The AND gate 20 of the comparator circuit 16 is formed by a pair of transistors 72, 74 serially coupled between the complementary phase output terminal 30 and system ground. The gates of the transistors 72, 74 are coupled to the output terminals 71a, 71b of the edge delay circuit 12 and the NOR gate 34. Thus, when the gates of the transistors 72, 74 are both logically high, then both conduct current, pulling the complementary phase output terminal 30 toward system ground. When neither, or only one, of the gates of the transistors 72, 74 are logically high, then the current source 60 supplies current to charge the complementary output terminal 30.

The NOR gate 22 of the comparator circuit 16 is formed by the AND gate 20 connected in parallel with a transistor 76. The gate of the transistor 76 is coupled to the complementary phase output terminal 28 through a terminal 77. Thus, when the complementary phase output terminal 28 reaches a logically high level, the transistor 76 conducts, pulling the complementary phase output terminal 30 to a logically low level. Likewise, when both input terminals of the AND gate 20 reaches a logically high level, the transistors 72, 74 conduct, pulling the complementary phase output terminal 30 to a logically low level.

The current source 60 is resistant to noise for at least two reasons. First, current sources in general are inherently resistant to variations in their supply voltage. Thus, variations in the magnitude of the voltage delivered by the power supply 62 has little or no impact on the current level delivered to the output terminal 30 as long as the input terminal 32 is varying with the voltage supply 62. Second, the resistor 64 and P-intrinsic transistor 66 are low noise devices as compared to standard MOS devices. The P-intrinsic transistor 66 is formed using only a single injected dopant. Ordinarily, MOS transistors (non-intrinsic) are formed using multiple dopings. Often, three doping steps are used to form a conventional transistor. As doping levels increase in a transistor, a phenomena known as flicker noise becomes more significant. Flicker noise, induced by a conventional transistor, can show up in the oscillator signal and ultimately reduce the performance of the telephone set. In the instant invention, less doping means less noise and better performance.

The low noise current source 60 generally performs well throughout most of its expected range of operation. However, as the voltage appearing at the terminal 30 approaches a power supply rail, such as system voltage, performance lags. Accordingly, the clamping transistors 68, 70 have been introduced to clamp the voltage to a stable level as the voltage at the terminal 30 approaches the rail.

Figure 3:
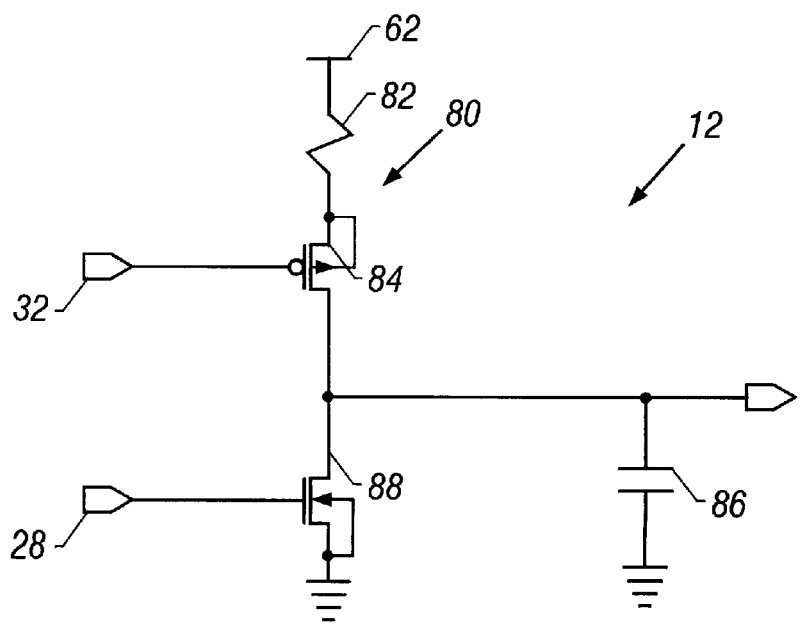
FIG. 3 illustrates an electrical schematic of one embodiment of a delay circuit of the voltage controlled oscillator of FIG. 1.

Turning now to FIG. 3, an electrical schematic of one embodiment of the edge delay circuit 12 of FIG. 1 is shown. A low noise current source 80 (similar to the current source 60 of FIG. 2) is coupled to the power supply 62. The current source 80 is formed from a serially connected resistor 82 and a P-intrinsic transistor 84. The gate of the transistor 84 is coupled to the control input terminal 32, such that an analog voltage placed on the control input terminal 32 affects the magnitude of the current supplied. A capacitor 86 is serially coupled between the current source 80 and system ground, such that the current source 80 is capable of charging the capacitor 86 at a rate determined by the magnitude of the current supplied by the current source 80. That is, the higher the voltage delta at the control input terminal 32 relative to Vcc, the more current that is supplied, and the faster the capacitor 86 charges.

A transistor 88 is coupled in parallel with the capacitor 86, and has its gate coupled to the complementary phase output terminal 28. Thus, when the complementary phase output terminal 28 is at a logically high level, the transistor 88 conducts, quickly pulling the complementary phase output terminal 28 to a logically low voltage level. On the other hand, when the complementary phase output terminal 28 is at a logically low level, the transistor 88 does not conduct, and the capacitor is relatively slowly charged toward a logically high voltage level by the current source 80.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A voltage controlled oscillator having first and second complementary output terminals, comprising:
    a first edge delay circuit having an input terminal, an output terminal, and a control input terminal, said input terminal being coupled to the first complementary output terminal, said first edge delay circuit being capable of delivering a signal on said output terminal that varies between first and second logic levels at first and second preselected rates in response to detecting a variation between first and second logic levels at said input terminal, said first edge delay circuit being capable of varying at least one of said first and second preselected rates in response to receiving a signal at said control input terminal;
    a first comparator having a first input terminal, an output terminal, and a control input terminal, said first comparator first input terminal being coupled to the output terminal of the first edge delay circuit, said first comparator output terminal being coupled to the second complementary output terminal, said first comparator circuit being capable of delivering a signal on said output terminal that varies between first and second logic levels at first and second preselected rates in response to detecting a variation between first and second logic levels at said first input terminal, said first comparator being capable of varying at least one of said first and second preselected rates in response to receiving a signal at said control input terminal, said control input terminals of said first edge delay circuit and said first comparator being coupled together; and
    a feedback circuit coupled between the second complementary output terminal and the first comparator circuit.

2. A voltage controlled oscillator, as set forth in claim 1, wherein said first edge delay circuit includes a current source coupled between a first terminal of a voltage supply and the output terminal of the first edge delay circuit, said current source having a control input terminal coupled to the first edge delay circuit control input terminal.

3. A voltage controlled oscillator, as set forth in claim 2, wherein said current source includes a transistor and a resistor serially coupled between the first terminal of the voltage supply and the output terminal of the first edge delay circuit, the transistor having a gate coupled to the control input terminal of the first edge delay circuit.

4. A voltage controlled oscillator, as set forth in claim 3, wherein said transistor is an intrinsic transistor.

5. A voltage controlled oscillator, as set forth in claim 2, including a transistor coupled between the output terminal of the first edge delay circuit and the voltage supply, said transistor having a gate coupled to the input terminal of the first edge delay circuit.

6. A voltage controlled oscillator, as set forth in claim 5, including a capacitor coupled between the output terminal of the first edge delay circuit and the voltage supply.

7. A voltage controlled oscillator, as set forth in claim 1, wherein said first comparator includes a second input terminal coupled to the first complementary output terminal, said first comparator being capable of pulling said second complementary output terminal to a first logic level in response to detecting a first logic level on said first complementary output terminal.

8. A voltage controlled oscillator, as set forth in claim 7, wherein said comparator includes an AND gate and a NOR gate, the AND gate having a first input terminal coupled to the output terminal of the first edge delay circuit, a second input terminal coupled to the feedback circuit, and an output terminal, the NOR gate having a first input terminal coupled to the output terminal of the AND gate and a second input terminal coupled to the first complementary output terminal.

9. A voltage controlled oscillator, as set forth in claim 1, wherein said first comparator includes a current source coupled between a first terminal of a voltage supply and the output terminal of the first comparator, said current source having a control input terminal coupled to the first comparator control input terminal.

10. A voltage controlled oscillator, as set forth in claim 9, wherein said current source includes a transistor and a resistor serially coupled between the first terminal of the voltage supply and the output terminal of the first comparator, the transistor having a gate coupled to the control input terminal of the first comparator.

11. A voltage controlled oscillator, as set forth in claim 10, wherein said transistor is an intrinsic transistor.

12. A voltage controlled oscillator, as set forth in claim 10, including a transistor coupled between the output terminal of the first comparator and the voltage supply, said transistor having a gate coupled to the input terminal of the first comparator.

13. A voltage controlled oscillator, as set forth in claim 5, including at least one diode and a second terminal of the voltage supply.

14. A voltage controlled oscillator having first and second complementary output terminals, comprising:

a first edge delay circuit having an input terminal, an output terminal, and a control input terminal, said input terminal being coupled to the first complementary output terminal;

a first comparator having a first, second and third input terminals, an output terminal, and a control input terminal, said first input terminal being coupled to the output terminal of the first edge delay circuit, said second input terminal being coupled to the first complementary output terminal, and said first comparator output terminal being coupled to the second complementary output terminal;

a second edge delay circuit; having an input terminal, an output terminal, and a control input terminal, said input terminal being coupled to the second complementary output terminal;

a second comparator having a first, second and third input terminals, an output terminal, and a control input terminal, said first input terminal being coupled to the output terminal of the second edge delay circuit, said second input terminal being coupled to the second complementary output terminal, and said second comparator output terminal being coupled to the first complementary output terminal, the control inputs of said first and second comparators and said first and second edge delay circuits being coupled together and adapted to allow each circuit to transition from at least one logic level to another logic level at a rate responsive to the magnitude of a signal applied thereto; and a feedback circuit coupled between the first and second complementary output terminals and the third inputs of the first and second comparator circuit.

15. A voltage controlled oscillator, as set forth in claim 14, wherein said first edge delay circuit includes a current source coupled between a first terminal of a voltage supply and the output terminal of the first edge delay circuit, said current source having a control input terminal coupled to the first edge delay circuit control input terminal.

16. A voltage controlled oscillator, as set forth in claim 15, wherein said current source includes a transistor and a resistor serially coupled between the first terminal of the voltage supply and the output terminal of the first edge delay circuit, the transistor having a gate coupled to the control input terminal of the first edge delay circuit.

17. A voltage controlled oscillator, as set forth in claim 16, wherein said transistor is an intrinsic transistor.

18. A voltage controlled oscillator, as set forth in claim 15, including a transistor coupled between the output terminal of the first edge delay circuit and the voltage supply, said transistor having a gate coupled to the input terminal of the first edge delay circuit.

* * * * *